United States Patent [19]

Cachon et al.

[11] 3,729,206

[45] Apr. 24, 1973

[54] VACUUM HOLDING APPARATUS

[75] Inventors: Rene P. Cachon, Wappingers Falls; Ariel L. Perlmann, Poughkeepsie; Michael A. Schorr, Hopewell Junction, all of N.Y.

[73] Assignee: International Business Machines Corporation, Armonk, N.Y.

[22] Filed: Oct. 21, 1971

[21] Appl. No.: 191,270

[52] U.S. Cl. ....................279/3, 269/21, B23b/31/30

[58] Field of Search ..........................279/3; 269/21; 51/235; 248/262, 263

[56] References Cited

UNITED STATES PATENTS 3,406,938 10/1968 Muir, Jr. ............................269/21 X
3,233,887 2/1966 Dunham ...............................269/21
3,052,479 9/1962 La Trell ...................................279/3

*Primary Examiner*—Gil Weidenfeld
*Attorney*—John F. Osterndorf et al.

[57] ABSTRACT

Automatically operated vacuum chuck apparatus employs fluidic logic selectively to retain semiconductor wafers or parts of broken wafers during processing. The chuck has vacuum connectors communicating with ports in a retaining surface that holds the wafer or part of the wafer. Individual fluidic logic circuits are connected in parallel to respective ones of these connectors and ports and in common to vacuum and pressure supplies. On apparatus actuation, those ports covered by the wafer or part thereof are sensed and vacuum is applied only to these ports under the control of the individual fluidic logic circuits.

7 Claims, 3 Drawing Figures

Patented April 24, 1973 3,729,206

2 Sheets-Sheet 1

INVENTORS
RENE P. CACHON
ARIEL L. PERLMANN
MICHAEL A. SCHORR

BY John F. Ostendorf

ATTORNEY

VACUUM HOLDING APPARATUS

BACKGROUND OF THE INVENTION

1. Field of the Invention

This invention relates to apparatus for vacuum holding semiconductor parts and, more particularly, to automatically operating vacuum chuck apparatus operative under the control of fluidic logic control circuits for retaining semiconductor wafers or parts of wafers.

2. Description of the Prior Art

During the processing of semiconductor wafers, in some operations, such as dicing or laser machining, the wafers are often broken into pieces. Although broken in pieces, it is necessary that salvage be made and that the pieces receive further processing. Such processes include visual inspection and electrical testing. For these processes, it is normal when operating on complete wafers to retain them on a vacuum chuck while the visual inspection apparatus or electrical probe arrangement is positioned over them for determining if the wafers meet a desired specification. Such a semiconductor wafer chuck is described in copending application Ser. No. 24,256 filed Mar. 31, 1970 in the name of Rene P. Cachon and assigned to the same assignee as this invention. The chuck described in this application does not provide for selectively individual vacuum control to be exercised at the surface retaining the wafer.

In the case of partial wafer structures, it is not possible to use the same vacuum retaining apparatus as all of the ports in the chuck are not covered by the part to be inspected or tested and a substantial loss accrues in the vacuum applying system. It is also the case that a smaller wafer structure cannot be retained on the same chuck for inspection or testing where there is a substantial change in size of the part. In many instances, the similar part does not cover all vacuum ports and the loss in the vacuum system is sufficient to preclude retaining the part. The result has been that the wafer has moved while the measuring or inspection apparatus is operating, preventing such parts from being inspected or tested. Heretofore, there has been no automatic way to resolve this problem. The only method available has been to block the open ports with tape or in the case of a change from a larger part to a smaller part to change the size of the chuck retaining the part.

It is well known in the art that vacuum may be employed to retain parts to a supporting structure. As examples, vacuum apparatus has been used in magnetic heads traversing a tape and in photographic apparatus. It is also known that pressure may be employed in a pneumatic type system for orienting wafers to a desired location in a supporting structure. Such an application is described in the IBM, Technical Disclosure Bulletin, September 1971 at page 1,021. However, in all of these applications, there has not been any selective control of the vacuum applying apparatus nor has there been any provision for shutting off the application of vacuum to those ports which are not covered by a part to be retained.

SUMMARY OF THE INVENTION

As contrasted with the prior art, the apparatus of the invention provides for the selective control of vacuum supply apparatus using fluidic logic. Vacuum is applied only to those ports covered by a semiconductor part to be retained during an inspection or testing operation. Each of a plurality of individual fluidic logic control circuits is connected to a respective port in the chuck and each has pressure and vacuum inputs from common sources. A control means positioned within each circuit is operative when conditioned to sense if its corresponding port in the retaining chuck is overlayed by the semiconductor structure. Each of the control circuits has a feedback path from its output to act in conjunction with the pressure input and the vacuum input.

All of the circuits of the control system are responsive to a single pressure pulse of fixed duration which subsequently controls the application of a short vacuum pulse to sense the presence of a part at the respective port. Through the operation of the feedback circuits in the individual logic control circuits, vacuum is applied only to those ports covered by a part when the pressure pulse is terminated. Retention of the part takes place so long as the vacuum is applied at those ports covered by a part and upon the exercise of a further release control, the vacuum is broken.

Employment of this apparatus substantially simplifies the retaining of broken wafers during the visual inspection and testing cycles. The time and personnel required for the individual masking of open ports is eliminated. The result is a significant increase in throughput of the broken wafers.

DESCRIPTION OF THE PREFERRED EMBODIMENTS

Figure 1:
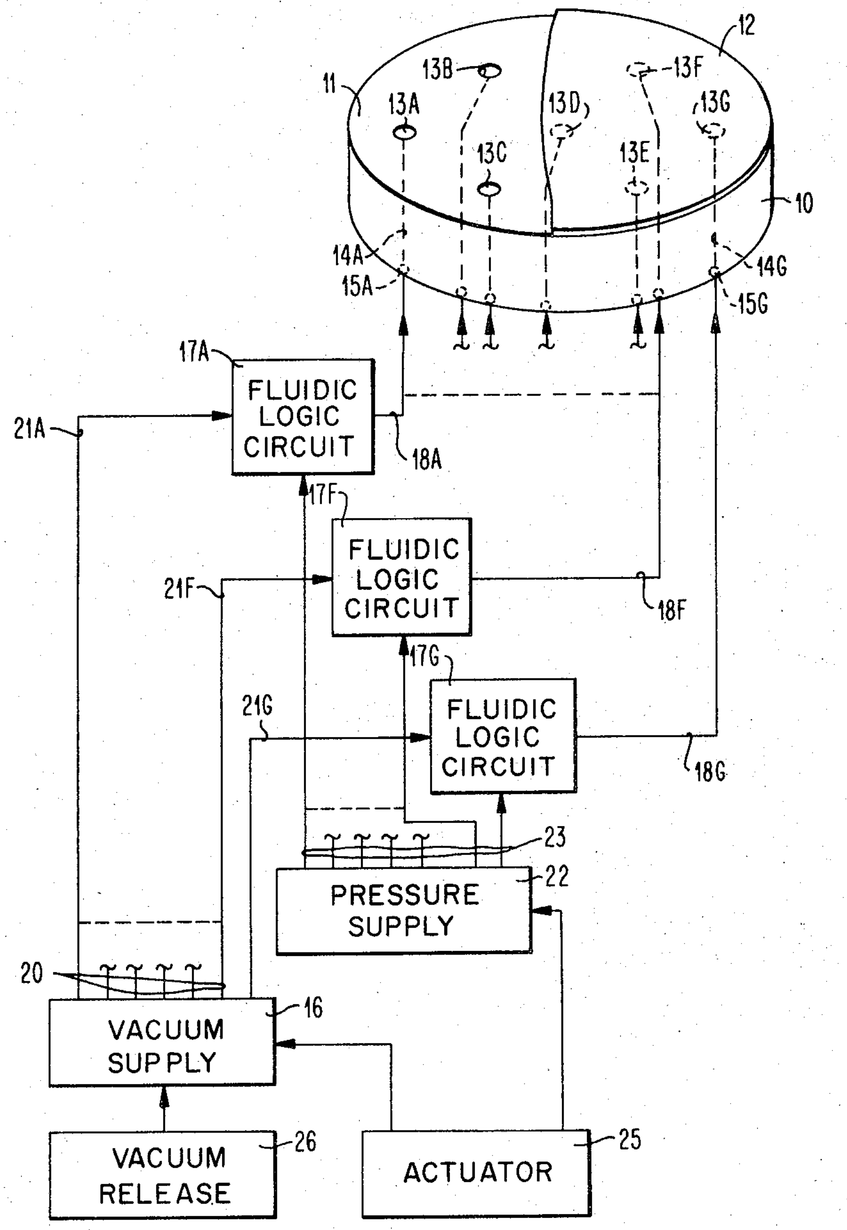
FIG. 1 is a schematic diagram of the fluidic logic control system for selectively applying vacuum to a chuck.

Referring now to FIG. 1, a chuck 10 is provided for retaining broken wafers or parts of wafers on its upper surface 11. A suitable ring or guard (not shown) may be disposed around the periphery of surface 11 to contain the wafer part. Such a partial wafer which will hereinafter be referred to as a wafer structure is indicated at 12 as covering a substantial portion of surface 11. A plurality of output ports 13A–13G in surface 11 are connected through individual connector ducts 14A–14G to entry ports 15A–15G.

When wafer structure 12 is a complete wafer, all of the ports 13A–13G are overlayed and covered by the structure. On application of a vacuum source at entry ports 15A–15G, a suction force is applied to the entire surface of the wafer structure at the locations 13A–13G. However, as is apparent, ports 13A–13G are not covered by any portion of the wafer structure 12. A loss in vacuum suction occurs when vacuum is applied in a non-selective manner at entry ports 15A–15G.

Vacuum is selectively applied at entry ports 15A–15G and to the individual communicating ducts 14A–14G from supply 16. The vacuum is provided through individual fluidic logic control circuits 17A–17G. Connection of the individual logic circuits 17A–17G to ducts 14A–14G is provided through individual output connections 18A–18G. Vacuum supply 16 is connected from a common supply line 20 through individual input lines 21A–21G to the control circuits. Also connected to the individual logic circuits is a source of pressure at 22. Connection is made through common connection 23.

Pressure supply 22 operates, when activated by actuator 25, to provide a single pulse of pressure for a fixed duration of time. The duration of the pulse is sufficient for sensing of the presence of the semiconductor structure to occur. In its simplest form, actuator 25 may be a hand operated or foot operated switch controlled by an operator. It may also be made automatically responsive to the positioning of the semiconductor structure on chuck 10.

The single input pressure pulse is applied simultaneously to each of the logic circuits 17A–17G. Concurrently, when vacuum supply is activated by actuator 25 it provides a continuous vacuum to each of the logic circuits 17A–17G through connections 21A–21G until released by a suitable releasing switch 26. Release 26 may also be an operator controlled switch or it may be responsive to the completion of a visual inspection or electrical test automatically to release the vacuum provided by supply 16.

Figure 2:
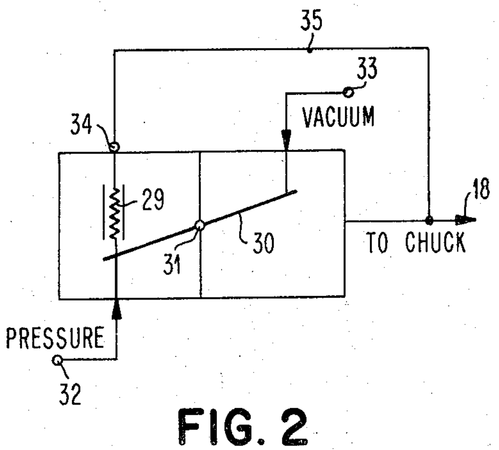
FIG. 2 is a schematic circuit diagram of an individual fluidic logic circuit.

As shown in the schematic diagram in FIG. 2 of the fluidic control circuit, each of the fluidic logic control circuits 17A–17G is a flip-flop fluidic logic device. In schematic form, it includes a vein 30 pivotable about point 31 under the control of a spring 29 actuated by the pressure pulse provided at 32 and the feedback fluidic signal at 34. Vacuum is applied at 33. The output connection at 18 is connected to a corresponding entry port 15, through a connector duct 14 in the chuck and thus to one of the ports 13. Feedback connection 35 couples this output to input 34.

In operation, when the apparatus is activated, each of the individual circuits has a constant vacuum applied at 33 and a single pressure pulse applied at 32. The pressure pulse drives vein 30 connecting vacuum input 33 to output connection 18. Vacuum is therefore applied to an output port in chuck 10. Sensing of the presence of wafer structure 12 takes place when the wafer structure covers the particular output port, then output 18 is at the same level of vacuum as the input at 33. Port 34 is also at the same level of vacuum as output connection 18. When the fixed duration of the input pressure pulse applied at 32 terminates, the vacuum at 34 is maintained keeping the circuit path from 33 to 18 open. Thus, vacuum is applied to that output port in chuck 10.

In the case where the wafer structure does not cover and overlay a port 13A–13C, vein 30 which has rotated in a clockwise direction about pivot point 31 on the application of the input pressure pulse is caused to revert to its original position (as shown in FIG. 2) on the termination of the input pressure pulse. Loss of vacuum at an output port reduces the level of vacuum at output 18 below that at input 33. Similarly, the feedback input at 34 is at the same level of vacuum as the output at 18. This vacuum level is insufficient to hold the vein after the input pressure pulse terminates causing the vein to revert to its original position. The vacuum circuit from 33 to 18 is broken and vacuum is not applied at the uncovered port of the chuck.

Figure 3:
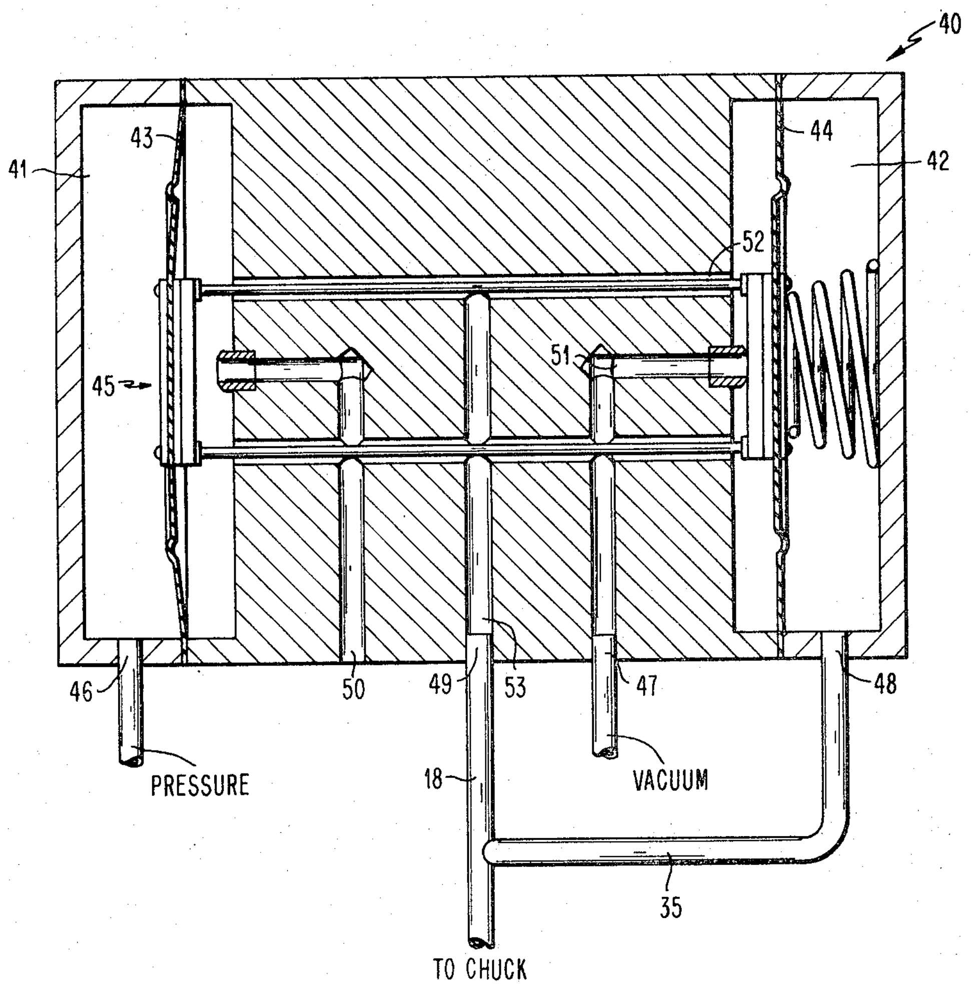
FIG. 3 is a sectional view of an individual fluidic logic circuit.

A sectional view of an individual fluidic logic circuit is shown in FIG. 3 as including a housing 40 having chambers 41, 42. Each chamber has a diaphram 43, 44 disposed within it and mounted to the walls of the housing. The diaphrams are coupled together by a slidable rod assembly 45. Entry ports are provided at 46 for accepting the pressure input, at 47 for the vacuum input and at 48 for the feedback connection. An exit port 49 is coupled to connector 18 for connection to an output port in the chuck 10. Feedback connector 35 couples output connector to entry port 48. An additional port 50 may be employed to accept a pressure input to act as a release for the fluidic logic circuit or it may be employed as part of the feedback circuit to retain the circuit in a given operating state.

When pressure is applied through port 46 to chamber 41, daphram 43 is acted upon displacing assembly 45 into chamber 42. At the same time, vacuum is applied through port 47 passing through ducts 51, 52 and 53 to exit port 49 as long as the assembly is displaced into chamber 42. When the pressure pulse of fixed duration terminates and if an output port in the chuck is covered by a semiconductor structure, the same level of vacuum at output port 49 is supplied through feedback connection 35 and entry port 48 to chamber 42. In this way, diaphram 44 is acted on and thus assembly 45 is retained within chamber 42, permitting vacuum to be applied to the chuck. If the output port in chuck 10 is not covered by a semiconductor structure, the level of vacuum in connector 18 decreases and vacuum cannot be applied through connection 35 to chamber 42 to retain the displacement of assembly 45 in chamber 42. The flow of vacuum is therefore shut off through ducts 51, 52 and 53.

Considering this operation for all of the fluidic logic circuits 17A–17G, each of the circuits first senses whether its corresponding output port in the chuck is covered by the wafer structure 12 and then, dependent on whether covered or not, provides for the continuous completion of the vacuum circuit from supply 16 to its corresponding port. Thus, in the illustration provided, vacuum would not be applied at the ports 13A, 13B and 13C whereas it would be provided at the other ports. Vacuum then is selectively applied where the structure to be retained covers an output port.

Although the apparatus of the invention has been described in conjunction with the handling of broken semiconductor wafers, it is recognized that if smaller complete parts are to be inspected or tested and retained during such operations, the same chuck apparatus could be used and would not have to be replaced in order to accommodate a smaller part. It is also to be recognized that suitable keying of a wafer part can be performed on the chuck so as to locate it, and that location identifying indicia may be provided so that visual alignment and manual adjustment for x, y and Θ positions may be accomplished.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. Apparatus for automatically retaining a semiconductor structure while being processed, comprising means when activated for supplying a constant vacuum, a chuck having a surface for retaining said structure at least partially overlaying said surface, said chuck having a plurality of independent fluidic connectors from respective inputs to output ports in said surface, and fluidic control means coupled to the respective inputs for sensing which parts are covered by the structure for selectively coupling said constant vacuum means only to those output ports covered by said structure and for preventing coupling of said constant vacuum means to those output ports not covered by said structure.

2. The apparatus of claim 1, wherein said fluidic control means comprises a plurality of fluidic control circuits corresponding in number to the number of connectors in said chuck for independently sensing the presence of said structure covering its corresponding port and for selectively coupling said vacuum means to those ports covered by said structure.

3. The apparatus of claim 2, wherein each of said fluidic control circuits comprises circuit completion means responsive to the conditioning of a circuit for a fixed period of time whereby said circuit is switched from a first to second state of operation to sense the presence of said structure overlaying the corresponding port, and feedback means coupling the output of said circuit to said circuit completion means to retain said circuit in the second state after the fixed period when the presence of said structure has been sensed whereby vacuum is applied to the corresponding output port and for causing said circuit to return to the first state of operation when the presence of said structure is not sensed whereby vacuum is not applied to the corresponding output port.

4. The apparatus of claim 3, wherein said apparatus comprises a source of pressure coupled to all of said circuits and operable when activated to produce pressure in single pulses of said fixed period to condition said circuits in said first state of operation.

5. The apparatus of claim 4, wherein said apparatus comprises means for activating both said constant vacuum means and source of pressure, and release means for deactivating said constant vacuum means after processing said structure.

6. In combination with a chuck for retaining a part of a broken semiconductor wafer, said chuck having a surface at least partially covered by said wafer, and a plurality of independent fluidic connectors from respective inputs to output ports in said surface, circuit means for selectively and automatically retaining said wafer to said surface while being processed, said circuit means comprising, a source of constant vacuum, a source of pressure pulses, fluidic control means coupled to the sources of vacuum and pressure and to the respective inputs for sensing which ports are covered by the wafer when conditioned by a pressure pulse from said pressure source and for selectively coupling said vacuum source only to those output ports covered by said wafer and for preventing coupling of said vacuum source to those output ports not covered by said wafer.

7. The apparatus of claim 1, wherein said fluidic control means comprises a plurality of fluidic control circuits corresponding in number to the number of connectors in said chuck for independently sensing the presence of said wafer covering its corresponding port and for selectively coupling said vacuum means to those ports covered by said wafer.

* * * * *

PO-1050
(5/69)

UNITED STATES PATENT OFFICE
CERTIFICATE OF CORRECTION

Patent No. 3,729,206 Dated Apr. 24, 1973

Inventor(s) Rene P. Cachon et al.

It is certified that error appears in the above-identified patent and that said Letters Patent are hereby corrected as shown below:

In the specification:

Column 2, line 56: "ports 13A-13G" should be -- ports 13A-13C --

In the claims:

Claim 1, Column 5, line 7: "parts" should be -- ports --

Signed and sealed this 29th day of January 1974.

(SEAL)
Attest:

EDWARD M. FLETCHER, JR.
Attesting Officer

RENE D. TEGTMEYER
Acting Commissioner of Patents